(12) United States Patent
Schenk et al.

(10) Patent No.: US 9,787,262 B2
(45) Date of Patent: Oct. 10, 2017

(54) DOHERTY AMPLIFIER WITH ADDITIONAL DELAY ELEMENT

(71) Applicant: Rohde & Schwarz GmbH & Co. KG, Munich (DE)

(72) Inventors: Lothar Schenk, Berlin (DE); Uwe Dalisda, Fuerstenfeldbruck (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/028,050

(22) PCT Filed: Aug. 21, 2014

(86) PCT No.: PCT/EP2014/067813
§ 371 (c)(1),
(2) Date: Apr. 8, 2016

(87) PCT Pub. No.: WO2015/090645
PCT Pub. Date: Jun. 25, 2015

(65) Prior Publication Data
US 2016/0254792 A1    Sep. 1, 2016

(30) Foreign Application Priority Data

Dec. 19, 2013  (DE) .................. 10 2013 226 635

(51) Int. Cl.
*H03F 3/68*       (2006.01)
*H03F 3/217*      (2006.01)
(Continued)

(52) U.S. Cl.
CPC ......... *H03F 3/2173* (2013.01); *H03F 1/0288* (2013.01); *H03F 1/42* (2013.01);
(Continued)

(58) Field of Classification Search
CPC . H03F 1/07; H03F 1/0288; H03F 3/68; H03F 1/3252; H03F 1/06; H03F 3/24;
(Continued)

(56) References Cited

U.S. PATENT DOCUMENTS

| 6,356,149 B1 | 3/2002 | Stengel et al. |
| 7,049,907 B2 | 5/2006 | Gurvich et al. |

(Continued)

FOREIGN PATENT DOCUMENTS

| EP | 0630104 A2 | 12/1994 |
| EP | 1653606 A1 | 5/2006 |

(Continued)

OTHER PUBLICATIONS

Wloczysiak, "Match the Ports of Differential Devices", Microwaves and RF, Feb. 19, 2010, pp. 1-7.*

(Continued)

*Primary Examiner* — Steven J Mottola
*Assistant Examiner* — Hafizur Rahman
(74) *Attorney, Agent, or Firm* — Ditthavong & Steiner, P.C.

(57) ABSTRACT

An amplifier includes two amplifier circuits and a power splitter. The power splitter splits a signal to be amplified and generates a phase displacement of 90° in the case of a rated frequency between resulting partial signals. In this context, the amplifier circuits each amplify one of the partial signals or respectively a signal derived from one of the partial signals. The amplifier additionally contains a first delay element, which is arranged between the power splitter and one of the amplifier circuits.

10 Claims, 6 Drawing Sheets

(51) Int. Cl.
*H03F 1/02* (2006.01)
*H03F 1/42* (2006.01)
*H03F 1/56* (2006.01)
*H03F 3/19* (2006.01)
*H03F 3/21* (2006.01)

(52) U.S. Cl.
CPC ................ *H03F 1/56* (2013.01); *H03F 3/19* (2013.01); *H03F 3/211* (2013.01); *H03F 2200/204* (2013.01); *H03F 2200/451* (2013.01)

(58) Field of Classification Search
CPC . H03F 3/60; H03F 3/2173; H03F 1/42; H03F 1/56; H03F 3/19; H03F 3/211; H03F 2200/204; H03F 2200/451
USPC ......... 330/10, 84, 86, 124 R, 126, 129, 130, 330/207 D, 295, 207 P; 333/117, 122, 333/124, 204, 205, 219, 248; 379/338, 379/443; 455/127.1, 143
See application file for complete search history.

(56) References Cited

U.S. PATENT DOCUMENTS

| 8,593,219 | B1 | 11/2013 | Root | |
|---|---|---|---|---|
| 2009/0134949 | A1 | 5/2009 | He | |
| 2009/0295473 | A1* | 12/2009 | Dupuy | ................ H03F 1/0222 330/124 R |
| 2015/0116039 | A1* | 4/2015 | Ahmed | ................ H03F 1/0233 330/295 |

FOREIGN PATENT DOCUMENTS

| EP | 2568598 A1 | 3/2013 | |
|---|---|---|---|
| WO | 9720385 A1 | 6/1997 | |
| WO | 0180420 A2 | 10/2001 | |
| WO | WO 2004088837 A2 * | 10/2004 | ........... H03F 1/0266 |
| WO | 2006066461 A1 | 6/2006 | |
| WO | 2012150126 A1 | 11/2012 | |

OTHER PUBLICATIONS

DAEnotes, "Delay Lines", http://www.daenotes.com/electronics/digital-electronics/delay-lines-types-uses, dated back to Nov. 2012.*

Tongchoi et al., "Lumped element based Doherty power amplifier topology in CMOS process", Proceedings of the 2003 International Symposium on Circuits and Systems, May 25, 2003, vol. 1, pp. 445-448.

Hussaini et al., "Design of power efficient power amplifier for B3G base stations", 9th International Symposium on Electronics and Telecommunications, Nov. 11, 2010, pp. 89-92.

Notification of Transmittal of Translation of the International Preliminary Report on Patentability (Chapter I or Chapter II) for International Application No. PCT/EP2014/067813, mailed Jun. 30, 2016, 8 Page.

* cited by examiner

DOHERTY AMPLIFIER WITH ADDITIONAL DELAY ELEMENT

CROSS-REFERENCE TO RELATED APPLICATIONS

The present application is a national phase application of PCT Application No. PCT/EP2014/067813, filed Aug. 21, 2014, which claims priority to German Patent Application No. 10 2013 226 635.9, filed on Dec. 19, 2013, the entire contents of which are herein incorporated by reference.

TECHNICAL FIELD

The invention, according to the various embodiments described herein, relates to an amplifier which can be operated as a Doherty amplifier and, by contrast with a Doherty amplifier, provides an additional delay element.

BACKGROUND

In radio broadcast technology, high-frequency amplifiers according to the Doherty principle have been increasingly used in recent years, especially in the case of modulation methods with a non-constant envelope and high crest factor, such as DVB signals. By comparison with conventional amplifiers, they are characterised by a significantly improved efficiency with hardly changed circuit complexity.

In this context, a main transistor, which is generally operated in AB mode, works with small input signals on an increased load resistance in such a manner that it reaches saturation even from a relatively low level, for example, 6 dB below the 1 dB compression point, and therefore operates with maximum efficiency. Above the level threshold specified by the saturation level in the main transistor, a second auxiliary transistor operates in C mode. Through its output signal, it reduces the load resistance of the main transistor. With full level control, the load resistance of the main transistor is accordingly reduced by the ratio between the level threshold and the 1 dB compression point, and the main transistor emits the correspondingly higher power. In the 6 dB example, half the resistance and therefore double the power is obtained.

From the level threshold, the main transistor therefore emits a rising output power in spite of saturation and, in this context, always operates with maximum efficiency. This is reduced only during the operating phases of the auxiliary transistor by its power consumption, but remains significantly higher by comparison with a conventional AB amplifier. With full level control of the amplifier in the signal peaks, both transistors each deliver half of the output power of the system.

The dynamic reduction of the load resistance of the main transistor takes place as follows: both transistors work on the same load resistance, which corresponds to half the system wave resistance, conventionally 25 ohms. In this context, the auxiliary transistor and the main transistor are connected directly to the load via an impedance inverter. At low levels, the auxiliary transistor does not operate. Its output is high ohmic and therefore provides no disturbance. The transistor capacitance is tuned through a matching network and a line. The main transistor works on the load enlarged by the impedance inverter. In the example with a 6 dB threshold, this is therefore 100 ohms. For this purpose, the impedance inverter has a wave resistance of 50 ohms. From the level threshold, the current of the auxiliary transistor superposes the current of the main transistor on the load resistance. Ideally, this occurs from an open circuit, so that it begins to deliver an increasing portion of the output power.

A line dimensioned to one quarter of the operating wavelength is conventionally used as the impedance inverter. This is compensated again in the branch of the main transistor, for example, also by a λ/4-line arranged behind the power splitter or by a 90° power splitter.

To ensure that the impedances from main transistor and auxiliary transistor behind the output matching network are real and high ohmic at the operating frequency, two offset lines are conventionally provided. In this manner, the output matching network can be freely dimensioned. Conversely, the offset line in the case of the main transistor also ensures that the dynamic change in resistance at the input of the impedance inverter, viewed from the main transistor, is transformed, in the 6 dB example, 100 to 50 ohms at the operating frequency in real terms to the drain.

Accordingly, for example, document WO 2012/150126 A1 shows a conventional Doherty amplifier. Although a Doherty amplifier already achieves a better efficiency than a conventional broadband amplifier, its efficiency is also not optimal.

SUMMARY

Accordingly, there is provided an amplifier with a very high efficiency.

An amplifier according to certain embodiments includes two amplifier circuits and a power splitter. In this context, the power splitter divides a signal to be amplified and generates a phase displacement of approximately 90°, preferably of precisely 90°, between resulting partial signals at a given rated frequency. In this context, the amplifier circuits each amplify one of the partial signals or respectively a signal derived from one of the partial signals. The amplifier according to the invention additionally contains a first delay element, which is arranged between the power splitter and one of the amplifier circuits. The delay element ensures an additional second phase displacement between the two signals to be amplified. In this manner, an increased efficiency and therefore also an increased useful bandwidth of the amplifier is achieved.

In certain embodiments, the second phase displacement is 5-50°. By particular preference, it is 20-30°. Accordingly, a total phase displacement of the partial signals is obtained as a sum of the first phase displacement and the second phase displacement of preferably 95-140°, by particular preference of 110-120°. An optimum efficiency can be achieved in this manner.

In certain embodiments, the amplifier further includes a hybrid coupler circuit in order to combine the resulting signals of the amplifier circuits to form a combined output signal. Furthermore, the hybrid coupler circuit serves for the compensation of the first phase displacement of 90°. In this manner, an output signal is achieved which corresponds to an input signal which has only been amplified but hardly distorted.

In certain embodiments, the first delay element in this context is connected between the power splitter and a first amplifier circuit. In this case, the first delay element is an inductance connected to ground. Alternatively, the first delay element is connected between the power splitter and a second amplifier circuit. In this case, the delay element can be a series-connected delay line or a capacitor connected to ground. In both cases, a second phase displacement is achieved between the signals to be amplified. The required phase displacement can be adjusted via the size of the inductance, the capacitance or the length of the delay line.

In certain embodiments, the amplifier further contains a first switch, which can either simply bridge the first delay element selectively and thereby functionally remove from the circuit, or, alternatively, switch between the first delay element and a second delay element. In this context, both options can also be combined. That is, the switch can be embodied to switch between the first delay element, a second delay element and a bridge. A very flexible usage of the amplifier is provided in this manner.

Within the scope of this application, any arbitrary switching element, for example, comprising PIN diodes or transistors or, for example, also as a relay, can be understood as the switch.

In certain embodiments, the amplifier is embodied to operate, at least at times, as a Doherty amplifier. In this case, the first amplifier circuit is embodied to operate as a main amplifier, while the second amplifier circuit operates as an auxiliary amplifier. Accordingly, the first switch connects the first delay element or optionally the second delay element between the power splitter and the respective amplifier circuit. By means of the two different delay elements, different phase displacement and accordingly different frequency ranges of the amplifier can be adjusted.

Furthermore, a high efficiency can be achieved through the operation as a Doherty amplifier.

In certain embodiments, the amplifier includes a second switch and a third delay element. In this context, the third delay element is connected between the power splitter and the amplifier circuit which is not connected to the first delay element. Accordingly, the third delay element serves to charge one of the signals to be amplified by the amplifier circuits with an additional third phase displacement. In this context, the second switch can be used to bridge the third delay element selectively or can switch between the third delay element and an optional fourth delay element. Here also, both options are can be combined with one another. That is, here also, a second switch is conceivable, which can switch between a third delay element, a fourth delay element and a bridge. In this manner, a particularly good flexibility of operation of the amplifier can be achieved.

In certain embodiments, the amplifier is embodied to operate, at least at times, as an inverted Doherty amplifier. In this case, the first amplifier circuit is configured as an auxiliary amplifier, and the second amplifier circuit is configured as a main amplifier. Accordingly, the first switch is embodied to bridge the first delay element and the second delay element. The second switch is then embodied to switch the third or fourth delay element between the power splitter and the respective amplifier circuit. Through the inverted Doherty operation, a further increase in the useful bandwidth of the amplifier is possible, since a different frequency range is achieved through the inverted configuration.

Furthermore, the amplifier is preferably embodied to operate, at least at times, as a broadband amplifier. In this case, the switches are embodied to bridge the delay elements. Accordingly, both amplifier circuits are operated at an identical operating point. In this case, the Doherty operation does not take place. A reduced efficiency is therefore provided. However, a significantly larger useful bandwidth is achieved at the same time.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

In the following, the invention is described merely by way of example with reference to the drawings in which exemplary embodiments of the invention are illustrated in a simplified manner. The drawings show.

DETAILED DESCRIPTION

Initially, with reference to FIGS. 1-7, the construction and functioning of various exemplary embodiments of the amplifier according to the invention are described. Following this, the advantages of the amplifier according to the invention are described with reference to FIGS. 8-10. The presentation and description of identical elements in similar drawings has not been repeated in some cases.

Figure 1:
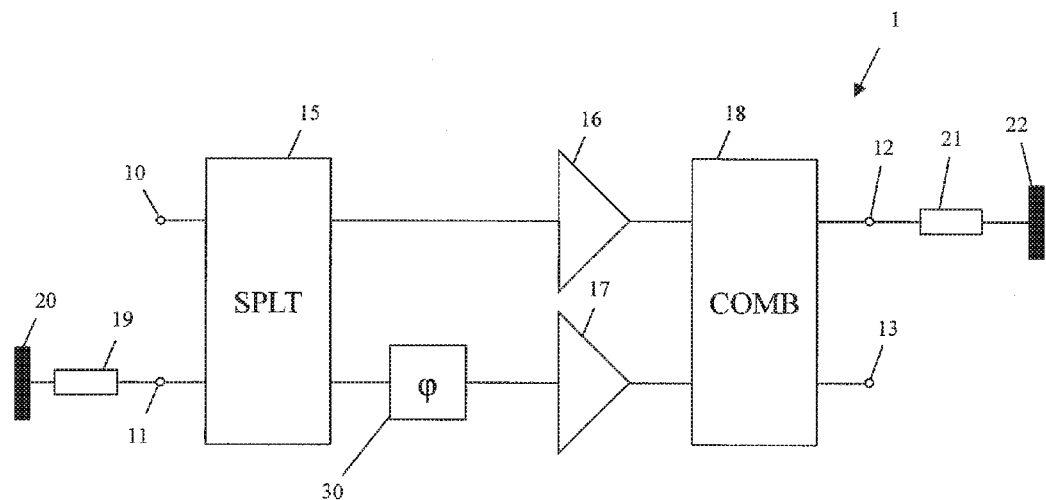
FIG. 1 a first exemplary embodiment of the amplifier according to the invention in a block-circuit diagram.

FIG. 1 shows a first exemplary embodiment of the amplifier 1 according to the invention. A power splitter 15 includes two input terminals 10 and 11. An input signal can be fed in at the first input terminal 10. The second input terminal 11 is terminated via a terminal resistor 19 at a ground terminal 20. Furthermore, a first amplifier circuit 16 and a second amplifier circuit 17 are connected to the power splitter 15. These form the main amplifier and the auxiliary amplifier according to the Doherty principle. Outputs of these amplifier circuits 16, 17 are connected to the hybrid coupler circuit 18. In this context, the hybrid coupler circuit 18 provides an insulation terminal 12 and an output terminal 13. Here, the insulation terminal 12 is terminated via a terminal resistor 21 at a ground terminal 22. The output signal of the amplifier 1 can be picked up at the output terminal 13.

In this context, the power splitter 15 already contains the $\lambda/4$ line required according to the Doherty principle for the delay of the signal in the main amplifier. The hybrid coupler circuit 18 here already contains the $\lambda/4$ line required for the function according to the Doherty principle, which delays the signal of the amplifier circuit 16. This additional delay is required in order to compensate the λ/4 delay of the signal of the auxiliary amplifier.

By contrast with a conventional Doherty amplifier, the amplifier 1 shown here additionally provides a first delay element 30, which is connected in series between the power splitter 15 and the second amplifier circuit 17.

The signal to be amplified is supplied to the input terminal 10 of the power splitter 15. The latter splits the signal and supplies one signal portion directly to the first amplifier circuit 16. The second signal portion is supplied to the delay element 30, delayed and then supplied to the second amplifier circuit 17. The amplifier circuits 16, 17 amplify signals according to the Doherty principle. The amplified signals are combined by the hybrid coupler circuit 18 at its output terminal 13. Through a configuration of the insulation terminal 12 of the hybrid coupler circuit 18, an optimal termination of the hybrid coupler circuit 18 is achieved at a given frequency.

Figure 2:
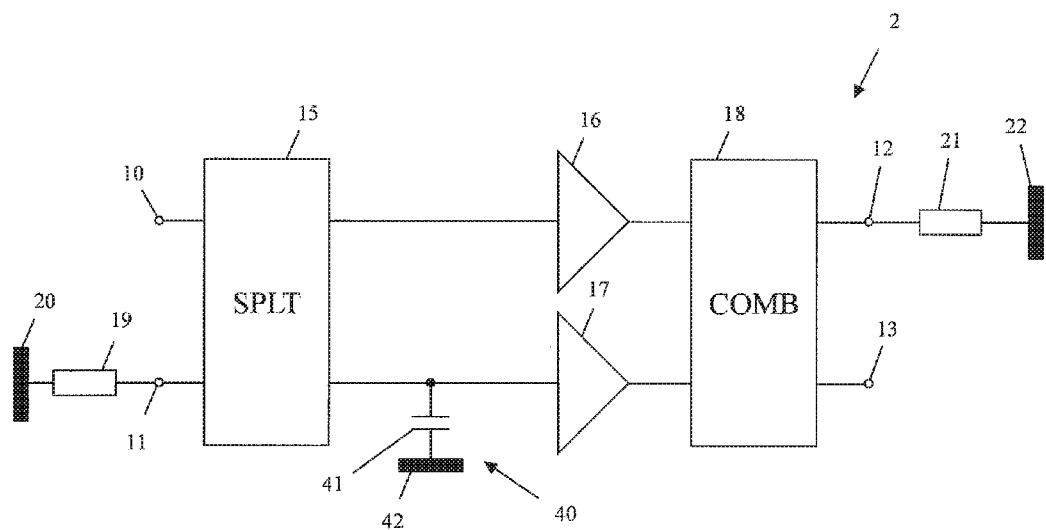
FIG. 2 a second exemplary embodiment of the amplifier in a block-circuit diagram is illustrated.

FIG. 2 shows a second exemplary embodiment of the amplifier 2 according to the invention. By contrast with FIG. 1, the generalised delay element 30 from FIG. 1 is replaced here by a concrete circuit example of the delay element 40. The delay element 40 includes a capacitor 41 which is connected to a ground terminal 42.

Figure 3:
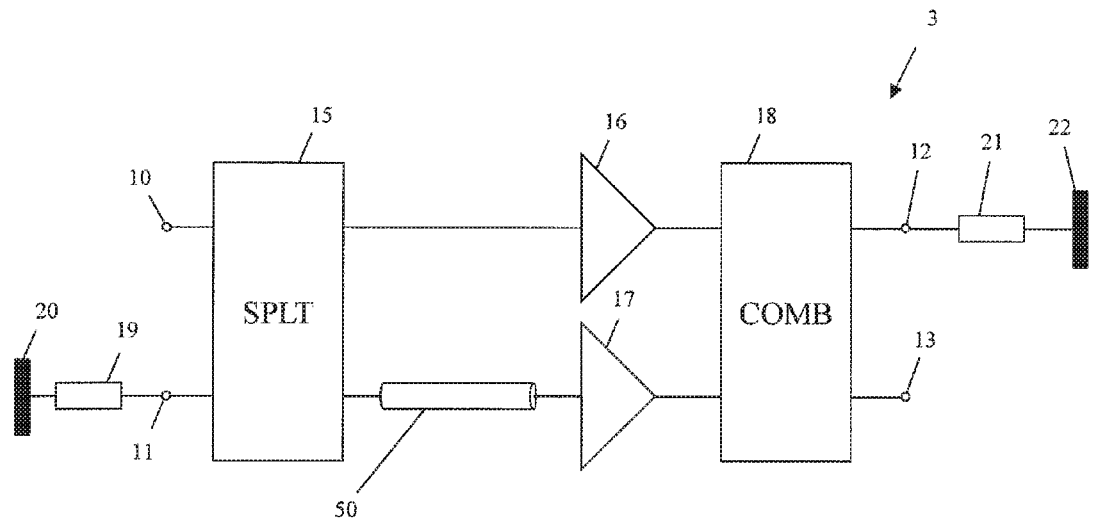
FIG. 3 a third exemplary embodiment of the amplifier in a block-circuit diagram is illustrated.

FIG. 3 shows a third exemplary embodiment of the amplifier 3 according to the invention. The generalised delay element 30 from FIG. 1 is replaced here by a delay line 50 which is connected in series between the power splitter 15 and the second amplifier circuit 17.

Figure 4:
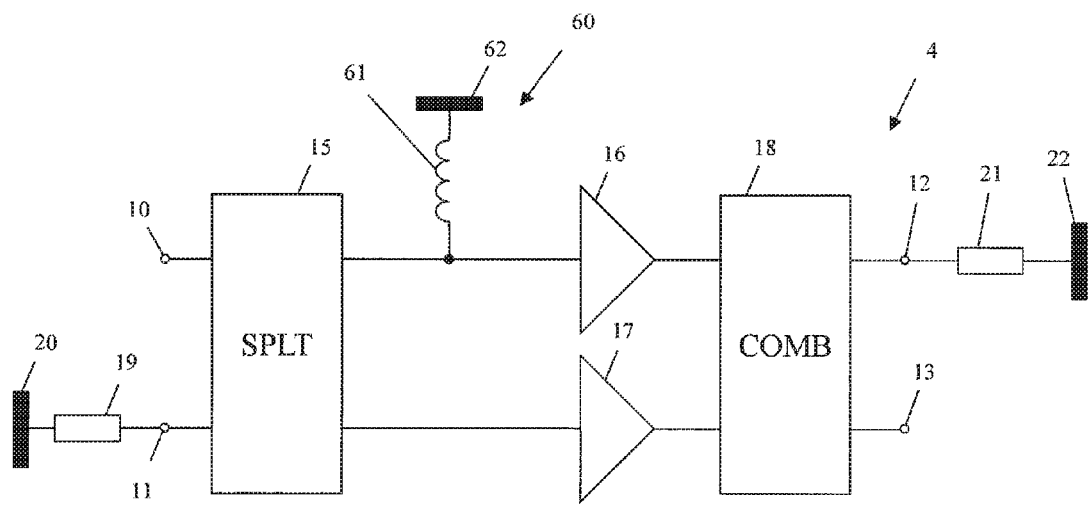
FIG. 4 a fourth exemplary embodiment of the amplifier in a block-circuit diagram is illustrated.

FIG. 4 shows a fourth exemplary embodiment of the amplifier 4 according to the invention. Here, the generalised delay element 30 from FIG. 1 is replaced by a concrete circuit example of a delay element 60. However, this delay element 60 is not arranged between the power splitter 15 and the second amplifier circuit 17 but between the power splitter 15 and the first amplifier circuit 16. In this context, the delay element 60 includes an inductance 61 which is connected to a ground terminal 62. In their function, the delay elements 30, 40, 50 and 60 are identical. All of these delay elements 30, 40, 50 and 60 cause a phase displacement of the signals to be amplified. In each case, a delay of the signal in the second amplifier circuit 17 is achieved by comparison with the signal in the first amplifier circuit 16.

By preference, this delay is 5-50°, by particular preference 20-30°. Empirical investigations have shown that, with these delay values, optimal efficiency levels can be achieved over a broad frequency range.

Figure 5:
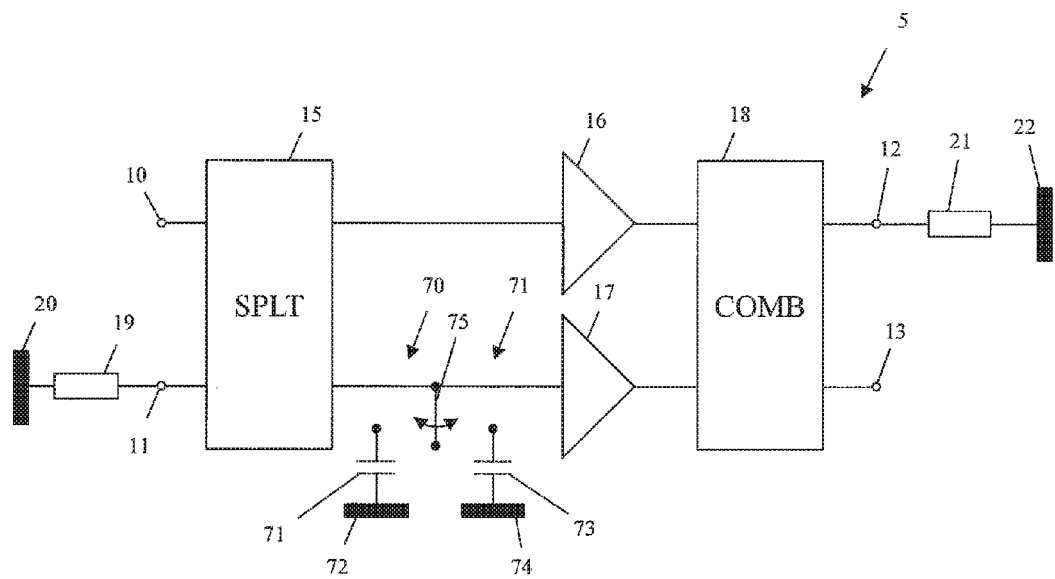
FIG. 5 a fifth exemplary embodiment of the amplifier in a block-circuit diagram is illustrated.

FIG. 5 shows a fifth exemplary embodiment of the amplifier 5 according to the invention. Here, too, delay elements 70, 71 are now disposed between the power splitter 15 and the second amplifier circuit 17. In this context, it is possible to switch between these two delay elements 70, 71 by means of a switch 75. In this context, the delay element 70 includes a first capacitor 71 which is connected to a ground terminal 72. In this context, the delay element 71 includes a second capacitor 73 which is connected to a ground terminal 74. By means of the switch 75, it is possible to connect only one of the delay elements 70, 71 to the power splitter 15 and to the second amplifier circuit 17 simultaneously. Alternatively, the switch 75 is embodied so that, in its middle position, it connects neither of the two delay elements 70, 71.

Accordingly, the two delay elements 70, 71 are designed for different frequency ranges of the amplifier by means of differently dimensioned capacitors 71, 73. That is, by means of the switch 75, it is possible to switch between two different frequency ranges of the amplifier 5. In the middle position, none of the delay elements 70, 71 is connected, and accordingly, no additional delay by comparison with the delay of 90° implemented by the power splitter 15 is present. In this position, the amplifier 5 can be used as a broadband amplifier. In this case, the two amplifier circuits 16, 17 are operated within an identical operating range. A very broad useful frequency range is obtained with a somewhat reduced efficiency by comparison with the operation as a Doherty amplifier with additional delay element 70, 71.

Figure 6:
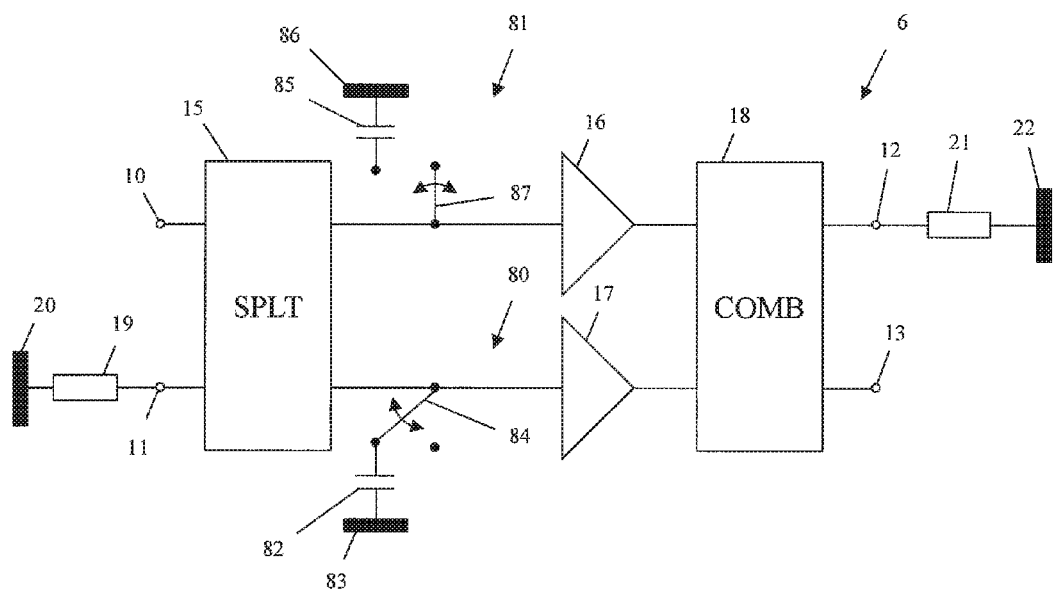
FIG. 6 a sixth exemplary embodiment of the amplifier in a block-circuit diagram is illustrated.

FIG. 6 shows a sixth exemplary embodiment of the amplifier 6 according to the invention. The amplifier 6 now contains a first delay element 80 which is connected between the power splitter 15 and the second amplifier circuit 17. Furthermore, the amplifier 6 contains a second delay element 81 which is connected between the power splitter 15 and the first amplifier circuit 16. In this context, both delay elements 80, 81 each comprise a switch 84, 87 and in each case a capacitor 82, 85, which are connected to a ground terminal 83, 86, respectively. In this context, the delay elements 80, 81 are embodied in such a manner that, always, only one of the capacitors 82, 85 is connected by means of the switches 84, 87 to the power splitter 15 and one of the amplifier circuits 16, 17. The respectively other switch 84, 87, in this context, is always open. The amplifier 6 shown here can therefore be switched between a broadband mode, in which both switches 84, 87 are open, an operating mode as a Doherty amplifier, in which the switch 84 is closed and the switch 87 is open, and an inverted Doherty amplifier, in which the switch 84 is open and the switch 87 is closed.

An operation as an inverted Doherty amplifier here has the additional advantage that a further frequency range is made available in this manner. Accordingly, with the inverted Doherty amplifier, the second amplifier circuit 17 is now used as the main amplifier, while the first amplifier circuit 16 is used as the auxiliary amplifier, thereby obtaining a different frequency range. Since the amplifier 6 can be switched between the broadband amplifier and the Doherty amplifier and the inverted Doherty amplifier, a high efficiency can be achieved over a broad frequency range. Operation can be secured across a very broad frequency range, at least through the broadband operating mode.

Figure 7:
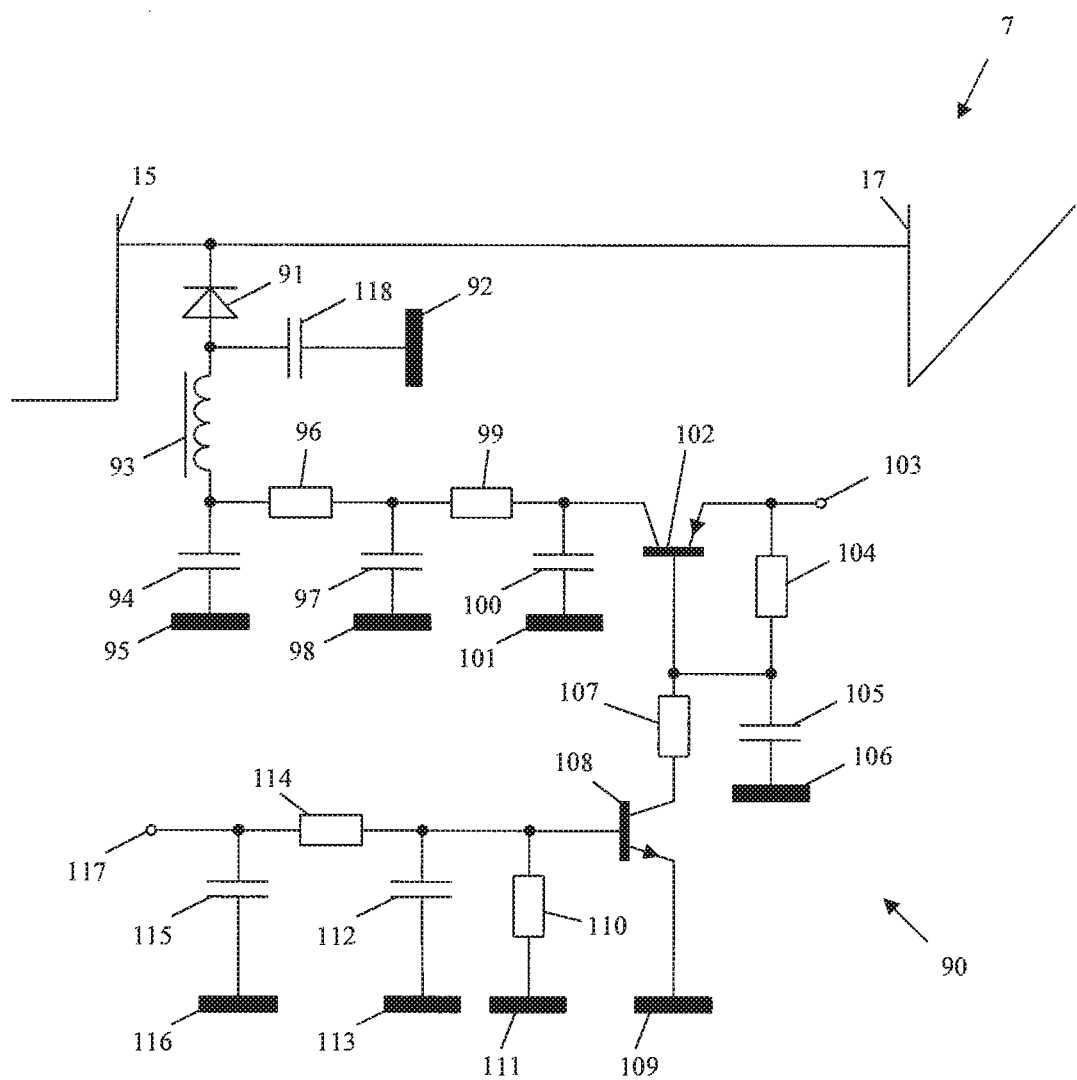
FIG. 7 a seventh exemplary embodiment of the amplifier in a block-circuit diagram is illustrated.

FIG. 7 shows a seventh exemplary embodiment of the amplifier 7 according to the invention. Here, only a detail of the amplifier 7 is shown. In particular, only a delay element 90 is shown here in a detailed circuit diagram. The delay element 90 illustrated here accordingly corresponds in its function to the delay element 80 from FIG. 6.

The delay element 90 contains a PIN diode 91, which is connected at its first terminal to the power splitter 15 and the second amplifier circuit 17. At its second terminal, the PIN diode 91 is connected to a first terminal of a capacitor 118. The second terminal of the capacitor 118 is connected to a ground terminal 92. At a second terminal, the PIN diode 91 is further connected to an inductance 93. The inductance 93 is further connected via a capacitor 94 to a ground terminal 95.

Furthermore, the inductance 93 and the capacitance 94 are connected via a resistor 96 to a resistor 99 and the capacitor 97. The capacitor 97 is connected at its further terminal to a ground terminal 98.

The resistor 99 is connected at its further terminal to a capacitor 100 and to a collector of a transistor 102. The capacitor 100 is connected at its further terminal to a ground terminal 101. The transistor 102 is connected at its emitter terminal to a resistor 104 and a supply-voltage terminal 103.

The transistor 102 is connected at its base to a further terminal of the resistor 104, to a first terminal of a capacitor 105 and to a first terminal of a resistor 107.

The second terminal of the capacitor 105 is connected to a ground terminal 106. The second terminal of the resistor 107 is connected to a collector of a further transistor 108. The emitter of the transistor 108 is connected to a ground terminal 109. The base of the transistor 108 is connected to a first terminal of a resistor 110, a first terminal of a capacitor 112 and a first terminal of a resistor 114. The second terminal of the resistor 110 is connected to a ground terminal 111. The second terminal of the capacitor 112 is connected to a ground terminal 113. The second terminal of the resistor 114 is connected to a first terminal of a capacitor 115 and to a control-signal terminal 117. The second terminal of the capacitor 115 is connected to a ground terminal 116.

Through a control of the voltage at the PIN diode 91, which is supplied to the PIN diode via the inductance 93, the PIN diode 91 can be switched into a conducting or non-conducting state. The PIN diode 91 accordingly acts as a switch which, in the conducting state of the PIN diode 91, connects the capacitor 118, which is connected to the ground terminal 92, to the power splitter 15 and to the second amplifier circuit 17, and, in the non-conducting state of the PIN diode 91 separates it from the power splitter 15 and the second amplifier circuit 17.

The other components of the delay element 90 serve, in this context, merely to provide the control voltage for the PIN diode 91. A control signal which controls the switch which is formed by the PIN diode 91 is supplied via the control signal terminal 117. In this context, the control signal passes the resistor 114 and is split by a voltage splitter which is formed by the resistors 110 and 114. The split voltage is then supplied to the base of the transistor 108 and controls the transistor 108. The capacitors 112 and 115, which are each connected to ground, serve in this context as coupling capacitors.

A constant supply voltage is supplied via the supply-voltage terminal 103. This is split via the resistors 104 and 107, which, in the conducting state of the transistor 108, act as a voltage splitter. In this case, a voltage is disposed at the base of the transistor 102 such that the transistor 102 also switches into a conducting state. However, if the transistor 108 is non-conducting, the full supply voltage is disposed at the base of the transistor 102 via the resistor 104. In this case, the transistor 102 is non-conducting. If the transistor 102 is conducting, the supply voltage is supplied from the supply voltage terminal 103, via the resistors 99 and 96 and the inductance 93, to the PIN diode 91 and places the latter in a conducting state. However, if the transistor 102 is non-conducting, the supply voltage 103 cannot pass the transistor 102 and therefore does not reach the PIN diode 91, which then remains in a non-conducting state. In this context, the capacitors 94, 97, 100 and 105 also serve as coupling capacitors.

Figure 8:
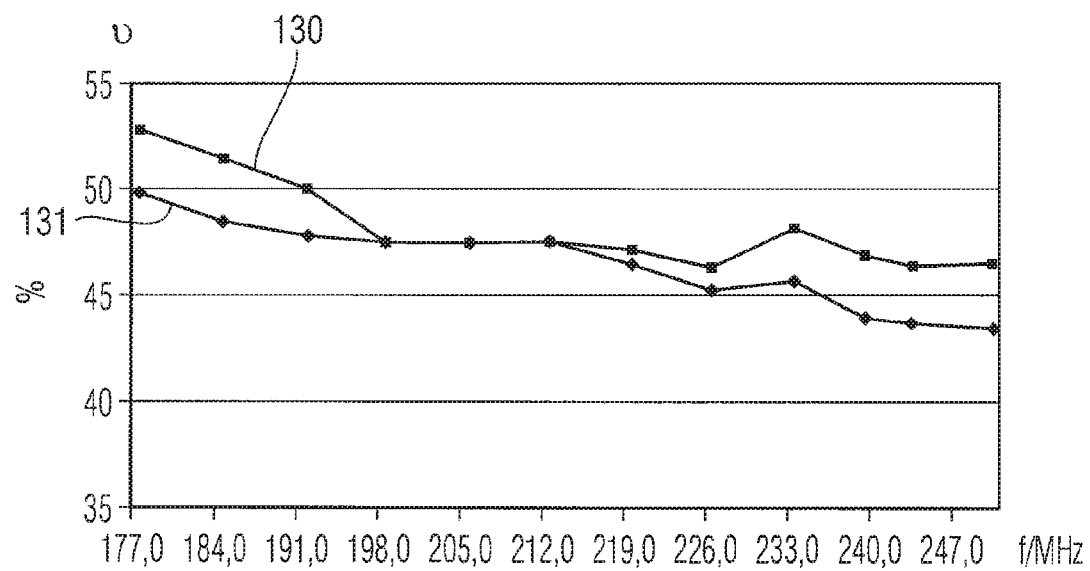
FIG. 8 a first diagram with measurement results of a conventional amplifier and an amplifier are illustrated.

FIG. 8 shows an efficiency characteristic 130 of an exemplary embodiment of the amplifier according to the invention against frequency. Additionally, an efficiency characteristic 131 of a conventional Doherty amplifier is shown for comparison.

Figure 9:
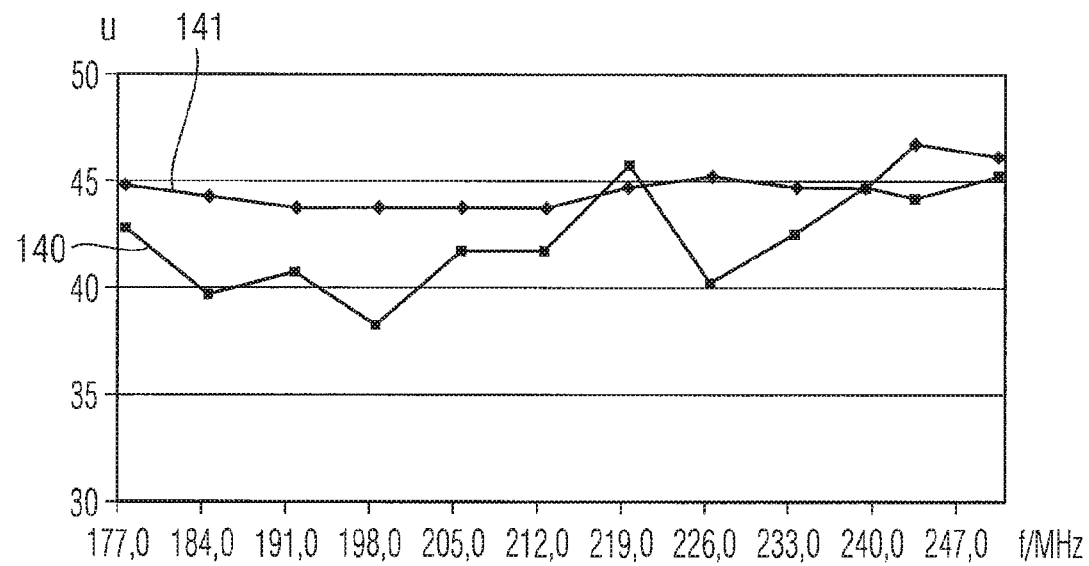
FIG. 9 a second diagram with measurement results of a conventional amplifier and an amplifier are illustrated.

FIG. 9 shows an operating-voltage characteristic 140 of an exemplary embodiment of the amplifier according to the invention against frequency. An operating-voltage characteristic 141 of the conventional Doherty amplifier is shown additionally for comparison.

Figure 10:
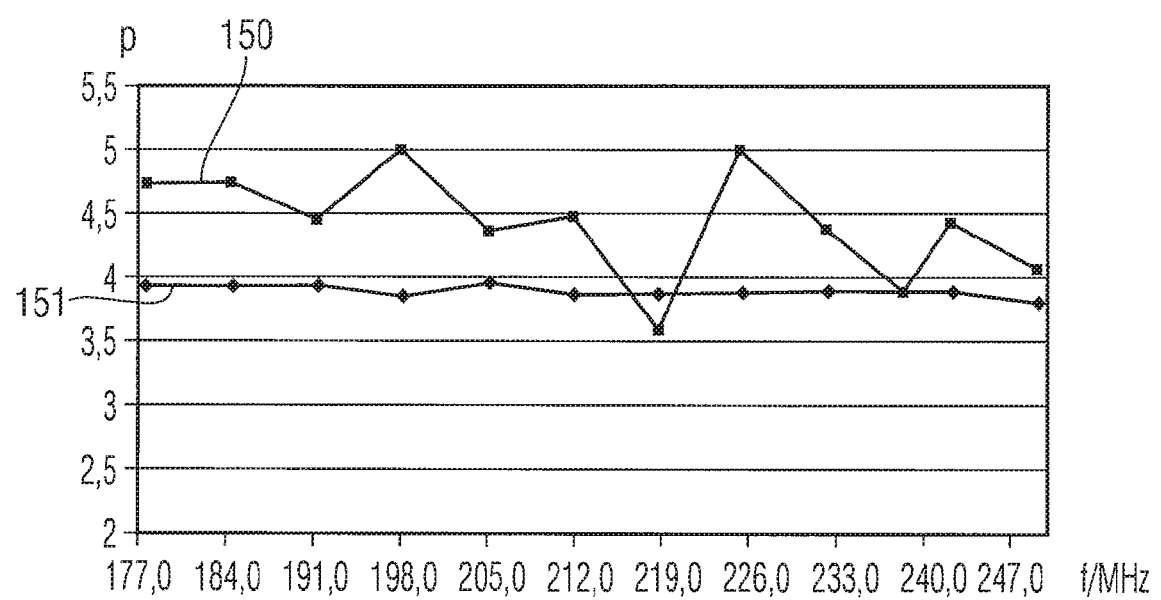
FIG. 10 a third diagram with measurement results of a conventional amplifier and an amplifier are illustrated.

Furthermore, FIG. 10 shows a peak-power characteristic 150 of an exemplary embodiment of the amplifier according to the invention and a peak-power characteristic 151 of a conventional Doherty amplifier for comparison.

The invention is not restricted to the exemplary embodiment shown. As already mentioned, different forms of delay elements can be used. Although only switchable capacitors are shown here as switchable delay elements, delay lines and inductances can also be designed to be switchable. The present invention is also possible in the context of a parallel circuit of several Doherty amplifiers or a parallel circuit of several amplifier circuits within a Doherty amplifier. Advantageously, all of the features described or features shown in the drawings can be combined arbitrarily with one another within the scope of the invention.

The invention claimed is:

1. An amplifier comprising:
   two amplifier circuits; and
   a power splitter,
   wherein:
   the power splitter is embodied to split a signal to be amplified and to generate a first phase displacement of approximately 90° between two resulting partial signals with a given rated frequency,
   the amplifier circuits are embodied, in each case, to amplify a signal derived from one of the partial signals,
   the amplifier contains at least one first delay element which is connected between the power splitter and one of the amplifier circuits,
   the first delay element is embodied to charge one of the signals to be amplified by the amplifier circuits with an additional, second phase displacement,
   the amplifier contains a first switching element,
   the first switching element is configured to: selectively bridge the first delay element and selectively set the second phase displacement equal to zero, or selectively switch between the first delay element and a second delay element, wherein the second delay element is configured to generate an alternative second phase displacement,
   the amplifier is configured to operate, at least at times, as a Doherty amplifier,
   the first amplifier circuit is configured to operate as a main amplifier, and the second amplifier circuit is configured to operate as an auxiliary amplifier,
   the first switching element is configured to connect the first delay element or the second delay element between the power splitter and the respective amplifier circuit,
   the amplifier is configured to operate, at least at times, as a broadband amplifier, and
   the switching elements are then configured to bridge the delay elements.

2. The amplifier according to claim 1, wherein the second phase displacement is 5° -50° and a total phase displacement of the partial signals, as a sum of the first phase displacement and the second phase displacement is 95° -140°.

3. The amplifier according to claim 2, wherein the second phase displacement is 20° -30° and a total phase displacement of the partial signals, as a sum of the first phase displacement and the second phase displacement is 110° -120°.

4. The amplifier according to claim 1, wherein the amplifier further comprises a coupler circuit which is configured to combine resulting signals of the amplifier circuits to form an output signal, and to compensate the first phase displacement between the partial signals.

5. The amplifier according to claim 4, wherein the coupler circuit comprises a hybrid coupler circuit.

6. The amplifier according to claim 1, wherein:
the first delay element is connected between the power splitter and a first amplifier circuit, and
the first delay element is an inductance connected to ground.

7. The amplifier according to claim 1, wherein:
the first delay element is connected between the power splitter and a second amplifier circuit, and
the first delay element is a delay line connected in series.

8. The amplifier according to claim 1, wherein:
the first delay element is connected between the power splitter and a second amplifier circuit, and
the first delay element is a capacitor connected to ground.

9. The amplifier according to claim 1, wherein:
the amplifier comprises a second switching element and a third delay element,
the third delay element is connected between the power splitter and the amplifier circuit which is not connected to the first delay element,
the third delay element is configured to charge one of the signals to be amplified by the amplifier circuits with an additional third phase displacement,
the second switching element is configured selectively to bridge the third delay element and selectively to set the third phase displacement equal to zero, and/or selectively to switch between the third delay element and a fourth delay element, wherein the fourth delay element is configured to generate an alternative third phase displacement.

10. The amplifier according to claim 9, wherein:
the amplifier is configured to operate, at least at times, as an inverted Doherty amplifier,
the first amplifier circuit is embodied to operate as an auxiliary amplifier, and the second amplifier circuit is embodied to operate as a main amplifier,
the first switching element is configured to bridge the first delay element and/or the second delay element, and
the second switching element is configured to connect the third and/or fourth delay element between the power splitter and the respective amplifier circuit.

* * * * *